(12) United States Patent
Shinoda (10) Patent No.: US 7,242,457 B2
(45) Date of Patent: Jul. 10, 2007

(54) EXPOSURE APPARATUS AND EXPOSURE METHOD, AND DEVICE MANUFACTURING METHOD USING THE SAME

(75) Inventor: Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 172 days.

(21) Appl. No.: 11/110,350

(22) Filed: Apr. 19, 2005

(65) Prior Publication Data
US 2005/0231702 A1 Oct. 20, 2005

(30) Foreign Application Priority Data
Apr. 20, 2004 (JP) ............................. 2004-123870

(51) Int. Cl.
G03B 27/54 (2006.01)
G03B 27/42 (2006.01)
(52) U.S. Cl. .......................................... 355/67; 355/53
(58) Field of Classification Search .................. 355/53, 355/55, 67–71; 250/548; 356/399–401
See application file for complete search history.

(56) References Cited

U.S. PATENT DOCUMENTS

| 6,243,206 B1 | 6/2001 | Wangler |
| 6,310,679 B1 * | 10/2001 | Shiraishi ....................... 355/53 |
| 6,414,743 B1 * | 7/2002 | Nishi et al. .................... 355/69 |
| 6,583,937 B1 | 6/2003 | Wangler et al. ............. 359/624 |
| 6,913,373 B2 * | 7/2005 | Tanaka et al. ............... 362/268 |
| 7,068,352 B2 * | 6/2006 | Irie .............................. 355/53 |
| 7,126,757 B2 * | 10/2006 | Mori ........................... 359/619 |
| 2003/0053036 A1 | 3/2003 | Fujishima ..................... 355/53 |

FOREIGN PATENT DOCUMENTS

| DE | 100 62 579 | 6/2001 |
| JP | 9-6011 A | 1/1997 |
| JP | 9-7941 A | 1/1997 |
| JP | 10-22217 A | 1/1998 |
| JP | 10-270351 A | 10/1998 |

OTHER PUBLICATIONS

European Search Report from a corresponding European Application No. 05252428.7, dated Apr. 20, 2007.

* cited by examiner

Primary Examiner—Henry Hung Nguyen
(74) Attorney, Agent, or Firm—Morgan & Finnegan, LLP (57) ABSTRACT

Disclosed is an exposure apparatus and method, and a device manufacturing method using the same. An exposure apparatus according to one preferred form of the invention includes an illumination optical system for illuminating an original with light from a light source, and a projection optical system for projecting a pattern of the original onto a substrate, wherein the illumination optical system includes an optical integrator for forming a secondary light source by use of light from the light source and a condenser optical system for directing light from the optical integrator to the original, and wherein the projection optical system includes an optical element such as a lens, made of a glass material of quartz and being disposed adjacent a pupil plane of the projection optical system.

9 Claims, 10 Drawing Sheets

EXPOSURE APPARATUS AND EXPOSURE METHOD, AND DEVICE MANUFACTURING METHOD USING THE SAME

FIELD OF THE INVENTION AND RELATED ART

This invention relates generally to an exposure apparatus and device manufacturing method. More particularly, the invention concerns an exposure apparatus and an exposure method as well as a device manufacturing method using the same, to be used in a lithographic process for manufacture of semiconductor devices or liquid crystal display devices, for example, for projecting and transferring a circuit pattern of an original onto a substrate having a photosensitive material applied thereto.

The manufacture of microdevices based on photolithography technology involves use of a projection exposure apparatus for projecting and transferring a pattern formed on an original such as a reticle onto a substrate such as a wafer through a projection optical system.

Generally, such projection exposure apparatus comprises an illumination optical system for illuminating a reticle (mask) with light from a light source, and a projection optical system for projecting a pattern of the reticle onto a wafer. Typically, for uniform illumination inside an illumination region, the illumination optical system is arranged so that light from the light source is introduced into an optical integrator such as a fly's eye lens and the reticle surface (or a surface being conjugate with it) is Kohler illuminated by use of a condenser lens and with light from a secondary light source plane defined at the exit surface of the optical integrator.

For high quality exposure, an optimum effective light source should be produced in accordance with the pattern of a reticle to be used. Here, the term "effective light source" means the angular distribution of exposure light incident on the wafer surface. It can be provided by adjusting, for example, the intensity distribution adjacent the exit surface of the fly's eye lens (i.e., secondary light source plane) into a desired shape (e.g., for standard illumination condition, ring-like illumination condition, quadrupole illumination condition and dual-pole illumination).

The resolution R of a projection exposure apparatus is given by the wavelength λ of the light source, the numerical aperture NA of the projection optical system and a constant $k_1$ determined by a developing process or the like, and it can be expressed as follows.

$$R = k_1(\lambda/NA)$$

Because of rapidly increasing density of microdevices, reduction in size of a pattern to be transferred, that is, improvement of resolution is required more and more. For higher resolution, as seen from the aforementioned equation, shortening the wavelength λ and enlarging the numerical aperture NA are effective.

For this reason, the wavelength of exposure light used in exposure apparatuses has been shortened from i-line (365 nm) to KrF excimer laser (248 nm) and to ArF excimer laser (193 nm). On the other hand, the numerical aperture NA keeps on increasing, from 0.70 to 0.75 and then to 0.85. Many proposals have been made in this regard such as, for example, Japanese Laid-Open Patent Applications, Publication Nos. 10-022217, 9-007941, 9-006011, and 10-270351.

Figure 3:
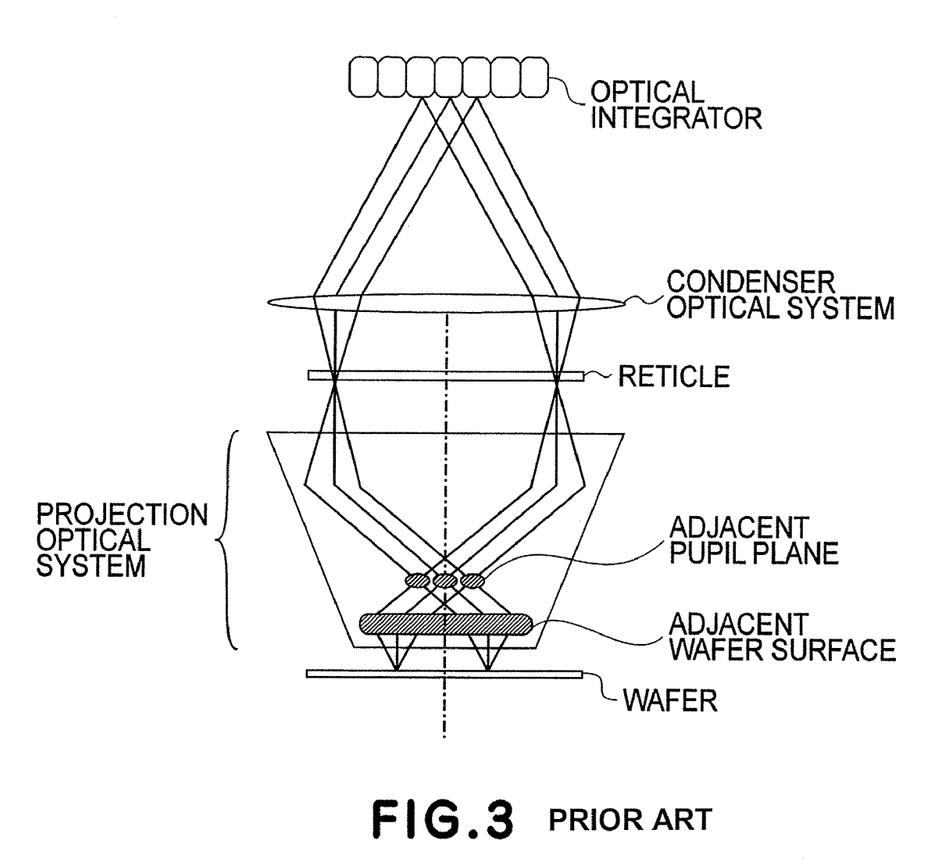
FIG. 3 is a schematic view of an exposure apparatus as conventional.

Optical elements that constitute a projection optical system of an exposure apparatus are now generally described. FIG. 3 is a schematic view of a projection optical system of an exposure apparatus. The projection exposure apparatus constitutes of optical elements of a number of 20 to 30. In this projection optical system, the place where the energy density becomes high is at a zone adjacent the wafer surface where the effective diameter is small and at a zone adjacent the pupil plane where the luminous points of the optical integrator are re-imaged.

Figure 4:
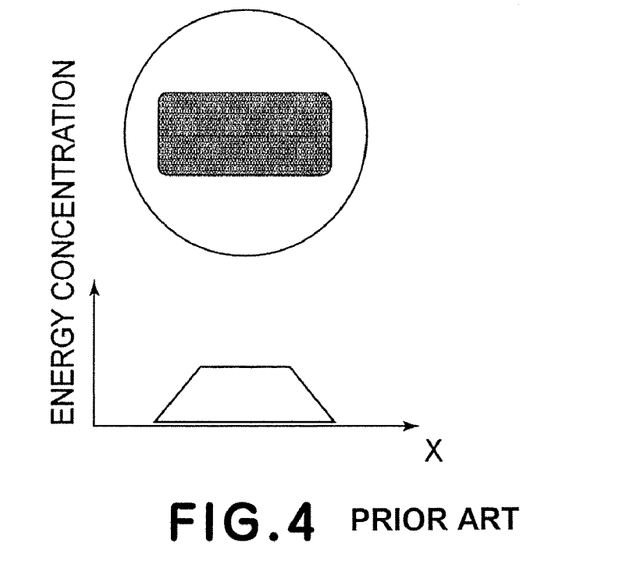
FIG. 4 is a schematic view for explaining an energy distribution adjacent the wafer surface, of a projection optical system as conventional.

FIG. 4 illustrates the energy distribution adjacent the wafer surface. It is seen that the energy distribution has an approximately uniform intensity distribution. This energy distribution can be detected from the illuminance on the wafer surface and the illumination area as determined by the illumination NA and the distance from the wafer. Although the energy density is high because it is concentrated in a relatively narrow area, no serious problem may arise if fluorite is used as the glass material in that portion of the lens.

Figure 5:
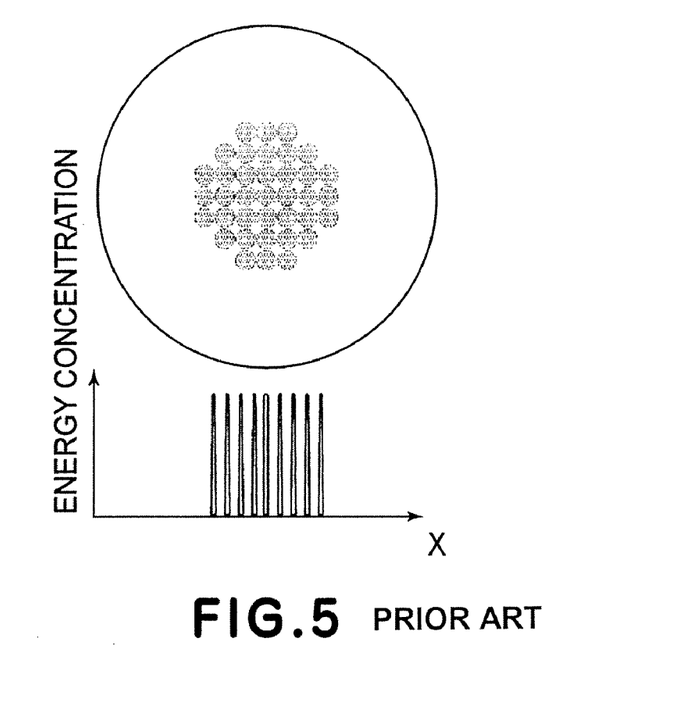
FIG. 5 is a schematic view for explaining an energy distribution adjacent a pupil plane of a projection optical system as conventional.

FIG. 5 shows the energy distribution adjacent the pupil plane. Since it is close to the position being optically conjugate with the secondary light source plane defined by the integrator, the distribution is formed by a distribution of re-imaged luminous points produced by the fly's eye lens. Thus, in a region close to the light convergence spots, the energy density is discrete and yet very high.

In conventional exposure apparatuses, this problem is met by keeping a sufficient space adjacent the pupil plane of the projection optical system. However, because of further enlargement of numerical aperture NA, it becomes difficult to keep a large space there and, in some cases, an optical element made of fluorite having good durability is disposed close to the pupil plane to meet this problem.

SUMMARY OF THE INVENTION

Taking into account the possibility of further enlargement of numerical aperture NA, it is desirable to further expand the effective diameter adjacent the pupil plane of a projection optical system. Additionally, it is desirable to doing correction of chromatic aberration on the basis of a combination of quartz (silica) and fluorite (regarding longitudinal chromatic aberration, use of a combination adjacent the pupil plane is effective).

Particularly, if the NA becomes more than 0.85, the required effective diameter adjacent the pupil plane would become too large to be met by fluorite. Furthermore, for correction of chromatic aberration, in some cases, quartz should be used in combination and disposed adjacent the pupil plane.

On the other hand, as the NA of projection system grows, high resolution techniques such as an exposure method using a phase shift mask and small-σ illumination in combination, or dual-pole illumination, for example, are often used. These illumination methods require more strictness in regard to the energy density at the pupil plane.

Considering these factors, it becomes more important to provide an exposure system in which the pupil plane of a projection system can meet a yet larger diameter while the energy density is kept suppressed and in which chromatic aberration is well corrected.

In accordance with an aspect of the present invention, there is provided a scanning exposure apparatus, comprising: an illumination optical system for illuminating an original with light from a light source; and a projection optical system for projecting a pattern of the original onto a substrate; wherein said illumination optical system includes an optical integrator for forming a secondary light source by use of light from the light source and a condenser optical system for directing light from said optical integrator to the original; and wherein said projection optical system includes an optical element made of a glass material of quartz and being disposed adjacent a pupil plane of said projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
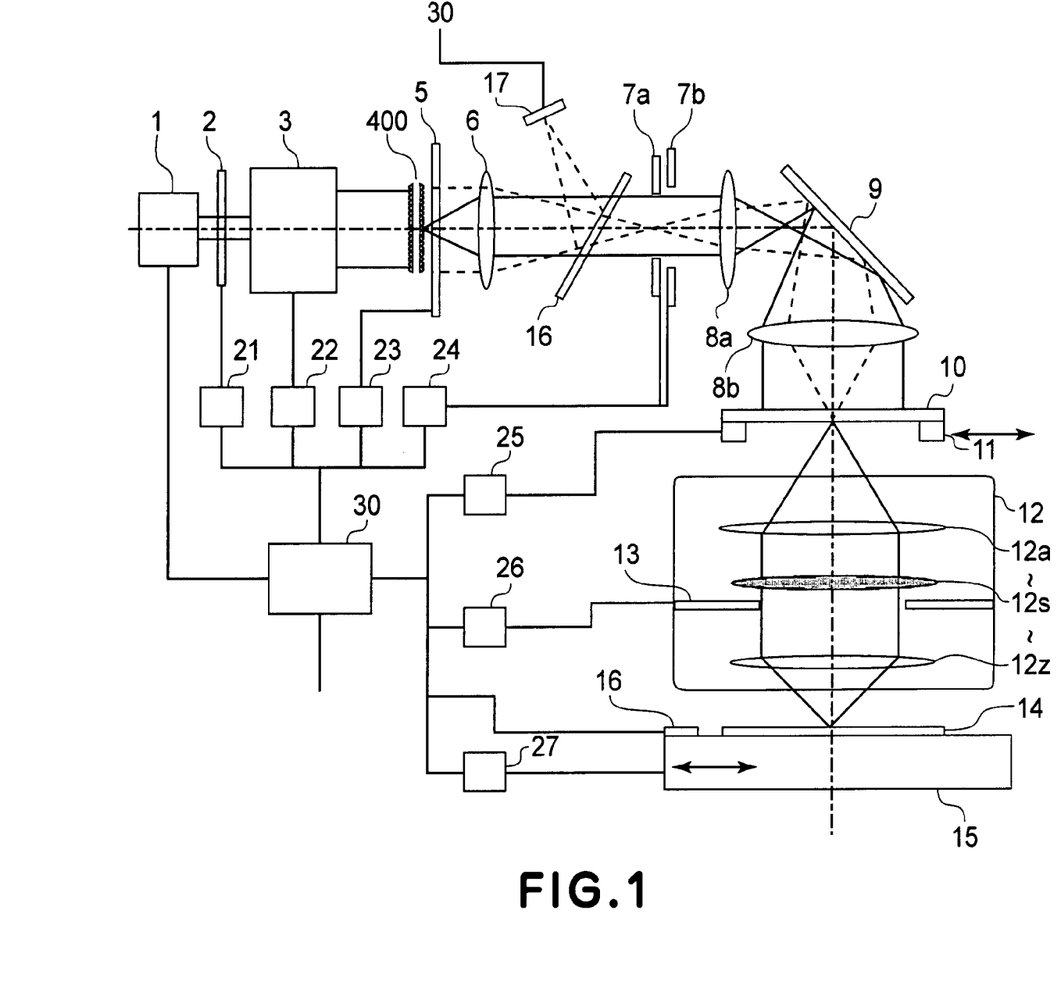
FIG. 1 is a schematic view of a main portion of an exposure apparatus according to a first embodiment of the present invention.

FIG. 1 is a schematic view of an exposure apparatus according to a first embodiment of the present invention, and it illustrates a step-and-scan (scanning or scan type) exposure apparatus.

Denoted in FIG. 1 at 1 is a light source which provides light of a wavelength of 180 nm to 200 nm, and it comprises an ArF excimer laser (193 nm), for example.

Denoted at 2 is a light attenuating (ND) member which comprises, for example, a plurality of ND (neutral density) elements having different transmittances. An ND driving means 21 is provided in association with it so provide an optical exposure amount on the surface of a wafer 14. Thus, the light attenuating member 2 can achieve fine attenuation rate adjustment.

Denoted at 3 is a beam shaping optical system which comprises a plurality of optical elements and a zoom lens, for example. The beam shaping optical system 3 is actuated by a lens system driving means 22 to control the light intensity distribution and the angular distribution as well of light to be incident on a succeeding optical integrator 400.

The optical integrator 400 to be descried later in detail is of wavefront division type, and it functions to produce secondary light sources (effective light source) adjacent a light exit surface thereof.

There is a stop 5 which disposed adjacent the light exit surface of the optical integrator 400, and a stop driving mechanism 23 is provided in association with it to change the size and shape of the stop 5 as desired.

Namely, by use of the beam shaping optical system 3, the optical integrator 400 and the stop 5 described above, a desired effective light source shape such as standard σ, ring-like, quadrupole-like, or dual-pole-like, for example, can be provided in accordance with a pattern of the reticle to be used.

Here, σ is a coherence factor which corresponds to the ratio of "illumination light NA to projection optical system NA".

Denoted at 6 is a condenser lens which serves to collect lights emitted from the secondary light sources, defined adjacent the light exit surface of the optical integrator 400, and to superimposedly project them upon a scan blade 7b surface (the surface to be illuminated) to thereby provide uniform illuminance distribution inside the illumination region on that surface.

Denoted at 18 is a half mirror which functions to reflect a few percent of the light emitted from the optical integrator 400, to direct the same to an integrated exposure amount measuring sensor 17. The sensor 17 is a detector (illuminometer) for continuously detecting the quantity of light during the exposure process, and it is disposed at a position optically conjugate with the wafer 14 surface or reticle 10 surface. The sensor 17 provides and applies a signal corresponding to the detection output to a main control unit 30.

The scan blade 7b comprises a plurality of movable plates. A scan blade driving mechanism 24 is provided in association with it to variably define a desired opening shape of the scan blade, thereby to restrict the exposure range upon the wafer 14 surface.

Furthermore, the scan blade 7b is made movable in a direction of an arrow in the drawing in synchronism with a reticle stage 11 and a wafer stage 15. Adjacent the scan blade 7b, a variable slit 7a is provided to increase the illuminance uniformness on the exposure surface after scan exposure.

Denoted at 8a and 8b are imaging lenses which serve to transfer the shape of the opening of the scan blade 7b onto the reticle 10 surface (surface to be illuminated) such that a required region of the reticle 10 surface can be illuminated uniformly.

Here, the optical system from after the laser 1 up to before the reticle 10 is called an illumination optical system in this specification.

The reticle 10 is held by a reticle stage 11, and the reticle stage 11 is controlled by a reticle stage driving system 25.

Denoted at 12 is a projection optical system for projecting a circuit pattern formed on the reticle 10 surface onto the reticle 14 surface in a reduced scale. It comprises a plurality of lenses 12a to 12z. Denoted at 13 is an NA stop for restricting the pupil region of the projection optical system. An NA stop driving mechanism 26 is provided to change the aperture size of the stop 13 to thereby make the NA of the projection optical system 12 changeable. Denoted at 14 is a wafer onto which a circuit pattern of the reticle 10 is to be projected and transferred. The wafer 14 is disposed at the exposure surface position. Denoted at 15 is a wafer stage which is made movable along the optical axis direction and also movable two-dimensionally along a plane orthogonal to the optical axis, while holding the wafer 14 thereon. The wafer stage 15 is controlled by a wafer stage driving system 27.

In exposure operation, the reticle stage 11 and the wafer stage 15 move to perform scan exposure in the direction of an arrow depicted in the drawing, while their motions are synchronized with each other. As regards the coordinates, upon the exposure surface the direction perpendicular to the scan direction is taken as X direction, the scan direction of the wafer stage 15 is taken as Y direction, and the optical axis direction of the projection optical system is taken as Z direction.

Denoted at 16 is a detector (illuminometer) for detecting the light quantity of exposure light incident on the wafer 14 surface. It has a light receiving portion being registered with the wafer 14 surface, and it moves together with the motion of the wafer stage and receives the illumination light inside the illumination region. It provides and applies a signal corresponding to the detection output thereof, to the main control unit 30. Denoted at 30 is the main control unit which controls various mechanisms and systems denoted at 21-27.

In accordance with a step-and-scan exposure method, scan exposure is carried out while the reticle 10 and the wafer 14 are moved in the direction of an arrow in the drawing, in synchronism with each other. If the reduction magnification of the projection optical system is 1/β and the scan speed of the wafer stage 15 is V (mm/sec), the scan speed of the reticle stage 11 is βV (mm/sec). The scan direction of the wafer stage 15 and the scan direction of the reticle stage 11 are opposite to each other.

Figure 2:
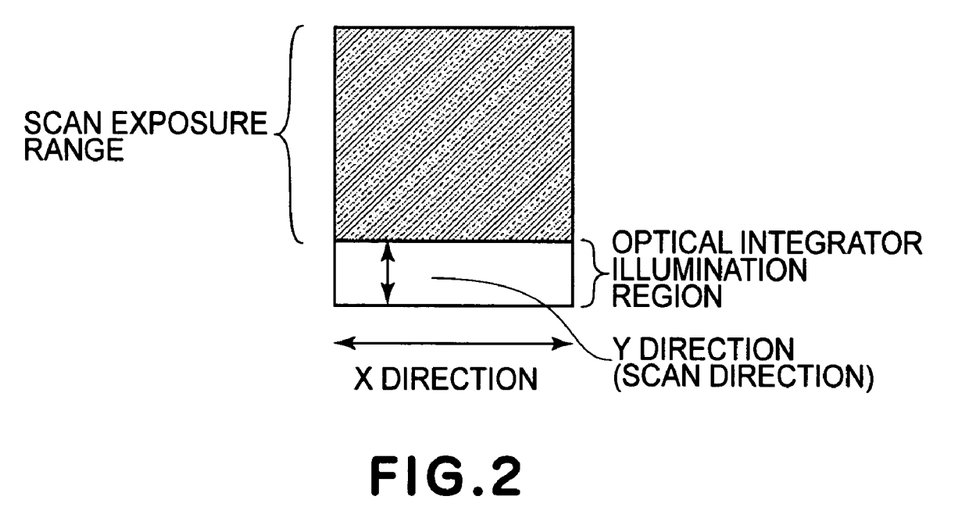
FIG. 2 is a schematic view for explaining an illumination region in a scan type exposure apparatus.

In a scanning exposure apparatus, as shown in FIG. 2, the illumination region on a wafer 14 has a shape being elongated in the X direction (lengthwise direction) and being short in the Y direction (widthwise direction). Through the scan along the Y direction (widthwise direction), one shot region is exposed.

In order to accomplish such rectangular illumination region, the pitch or shape of small lenses that constitute the optical integrator 400 is determined specifically.

If for example the curvature of the small lens should be made the same in both of X and Y directions, for accomplishing rectangular illumination the opening shape of the small lens should be set as rectangular which is approximately analogous to that of the illumination region.

If on the other hand the pitch of the small lenses should be made the same in both of the X and Y directions, for accomplishing rectangular illumination the curvatures in the X and Y directions are made different from each other.

As regards the glass materials usable with a wavelength 193 nm, there are almost only two materials of high-purity quartz or silica ($SiO_2$) and fluorite ($CaF_2$). Hence, when an exposure apparatus is constitute by optical elements, they should be provided in an optimum disposition taking into account the features of quartz and fluorite, respectively.

Fluorite has a refractive index of about 1.50 with respect to light of a wavelength 193 nm, and it has good durability. However, a large diameter is difficult to make.

On the other hand, quartz has a refractive index of about 1.56 with respect to the wavelength 193 nm, and making a large diameter is relatively easy. However, the durability is lower than that of fluorite. Furthermore, it has been reported that when the energy density projected is greater than 0.1 $mJ/cm^2$, a phenomenon (called "compaction") that the refractive index increases due to reduction in volume occurs.

Hence, for optical elements that constitute an exposure apparatus, it is necessary to carefully choose fluorite or quartz in accordance with the energy density.

Figure 6:
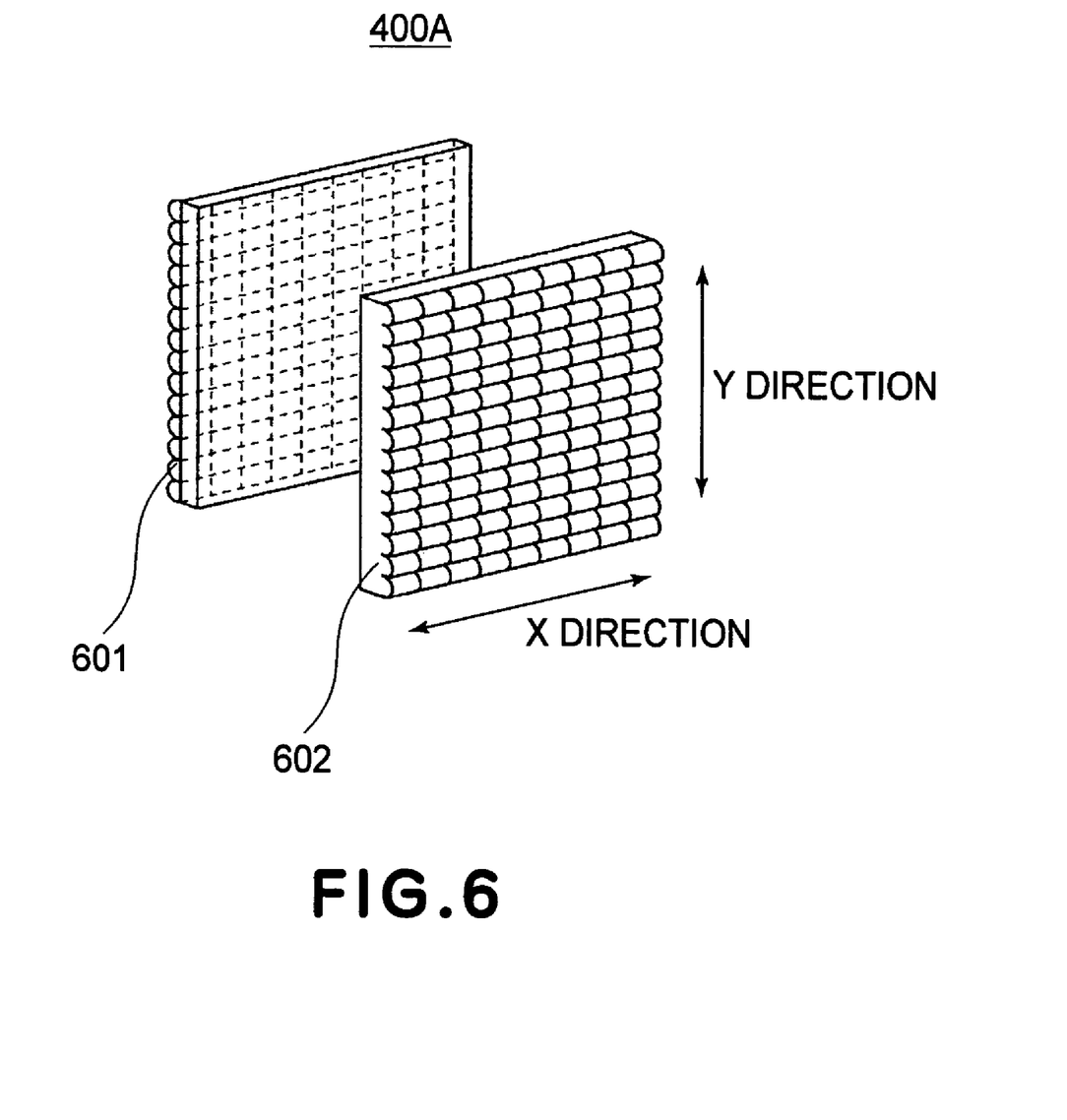
FIG. 6 is a schematic view for explaining micro-lens arrays 400A.

In the first embodiment of the present invention, quartz 12s is used as the glass material for an optical element (lens) adjacent the pupil plane of the projection optical system 12 and, additionally, as the integrator 400, a micro-lens array 400A such as shown in FIG. 6 is used.

In conventional optical integrator of a structure such as shown in FIG. 3, the pupil division number of the integrator is up to about 50 at the most with respect to σ=1.0. Under an illuminance condition of σ=0.3 or more, the energy density at adjacent the pupil plane of the projection optical system would be 0.1 $mJ/cm^2$ or less and it does not raise a problem. However, under an illuminance condition that σ is less than 0.3, the energy density would be greater than 0.1 $mJ/cm^2$, causing degradation of imaging performance due to compaction or degradation of durability.

On the other hand, the present embodiment uses a micro-lens array 400A, and this makes it possible to reduce the energy density to 0.1 $mJ/cm^2$ or less even with an illumination condition of σ=0.3 or less.

FIG. 6 illustrates details of a first example of micro-lens array 400A usable in an exposure apparatus according to the first embodiment of the present invention. As shown in the drawing, it comprises a sheet-like structure wherein small lenses are arrayed two-dimensionally. The opening of each small lens has a shape approximately analogous to the illumination shape.

Generally, the illumination shape of a scan type exposure apparatus is short in the scan direction (Y direction) and long in the X direction, the opening shape of the small lens as well is being elongated in the X direction.

The micro-lens array 400A comprises a pair of sheets 601 and 602. The light entrance side sheet 6001 has a curvature at its light entrance surface, while the light exit surface thereof is plane. The light exit side sheet 602 has a plane light entrance surface, and it has a curvature at its light exit surface.

In order to lower the energy density at the pupil plane of a projection optical system, increasing the number of division to decrease the light quantity at each light convergence spot will be effective. Furthermore, increasing the number of division with respect to the X direction will provide an additional advantage of reducing the difference, between illumination modes, in relation to variation of magnification of an image produced on a wafer due to defocus.

However, if the division number is too large, light rays emitted from the small lenses may interferer with each other upon a wafer surface, causing adverse influence on the pattern formation.

This phenomenon will be described below in more detail.

Depending on the coherence length of light incident on an optical integrator, light rays which are emitted from point light sources of a large number of secondary light sources created mutually closely with certain spacings may interfere with each other. As a result of such interference, a one-dimensional or two-dimensional interference fringe that corresponds to the direction of disposition of the large number of secondary light sources may appear on the reticle or wafer surface. The sharpness of such interference fringe depends on the coherent length of the laser light. Where the laser light is excimer laser, since the coherence of light is relatively weak, it can be stated that only mutually juxtaposed secondary light sources may cause weak interference.

In order to suppress such interference fringe, a special device may be incorporated into the illumination optical system. For example, a reflection mirror may be disposed in a portion of the light path and it may be oscillated to change its angle. Alternatively, an angle deviating element may be disposed in the light path and it may be rotated about the optical axis. By using such interference fringe moving means, the interference fringe can be shifted on the surface to be illuminated, such that the illuminance distribution of laser light can be uniformed throughout the exposure time. Thus, the interference fringe can be apparently suppressed.

It is now assumed that the spacing between X-direction light focused spots produced by the small lenses of the optical integrator is Fx. The spacing Fx is determined by the diameter of the small lens. The wavelength used is λ, and the focal length of the condenser lens is f.

When parallel light having no NA is incident on the optical integrator, the interference fringe to be produced on the reticle corresponds to the Fourier transform of the light convergence spots of the optical integrator, and the pitch Px in X direction can be given by $$Px=f\cdot\lambda/Fx$$

If this interference fringe is moved N times, for example, by using the interference fringe moving means described above, the interference pitch can be narrowed to Px/N and thus more uniform illumination can be assured.

If the pitch Fx of the small lenses is narrowed unconditionally, since the pitch Px on the reticle (and finally on the wafer) is enlarged, the number of interference fringe movements in the exposure period has to be increased accordingly. Practically, however, there is a limit in the driving speed of the interference fringe moving means.

In consideration of the above, in this embodiment, the dividing number M of the micro-lens array in X direction with respect to σ=1.0 upon the pupil plane is set to satisfy a relation $$100 \leq M \leq 300$$

On the other hand, regarding the dividing number in Y direction, projecting plural pulses during the scan exposure has an advantageous effect of further reducing the interference fringe. Thus, the division number in the Y direction can be made larger than that in the X direction.

The shape of opening of the small lens as depicted in FIG. 6 is approximately analogous to the shape of illumination region on the reticle and that of illumination region on the wafer. Therefore, the number of division in the Y direction can be determined certainly on the basis of the division number in the X direction. If for example the ratio between the X-direction length and the Y-direction length of the shape of the illumination region is 3:1, the number N of the division in the Y direction will be $300 \leq N \leq 900$.

Figure 7:
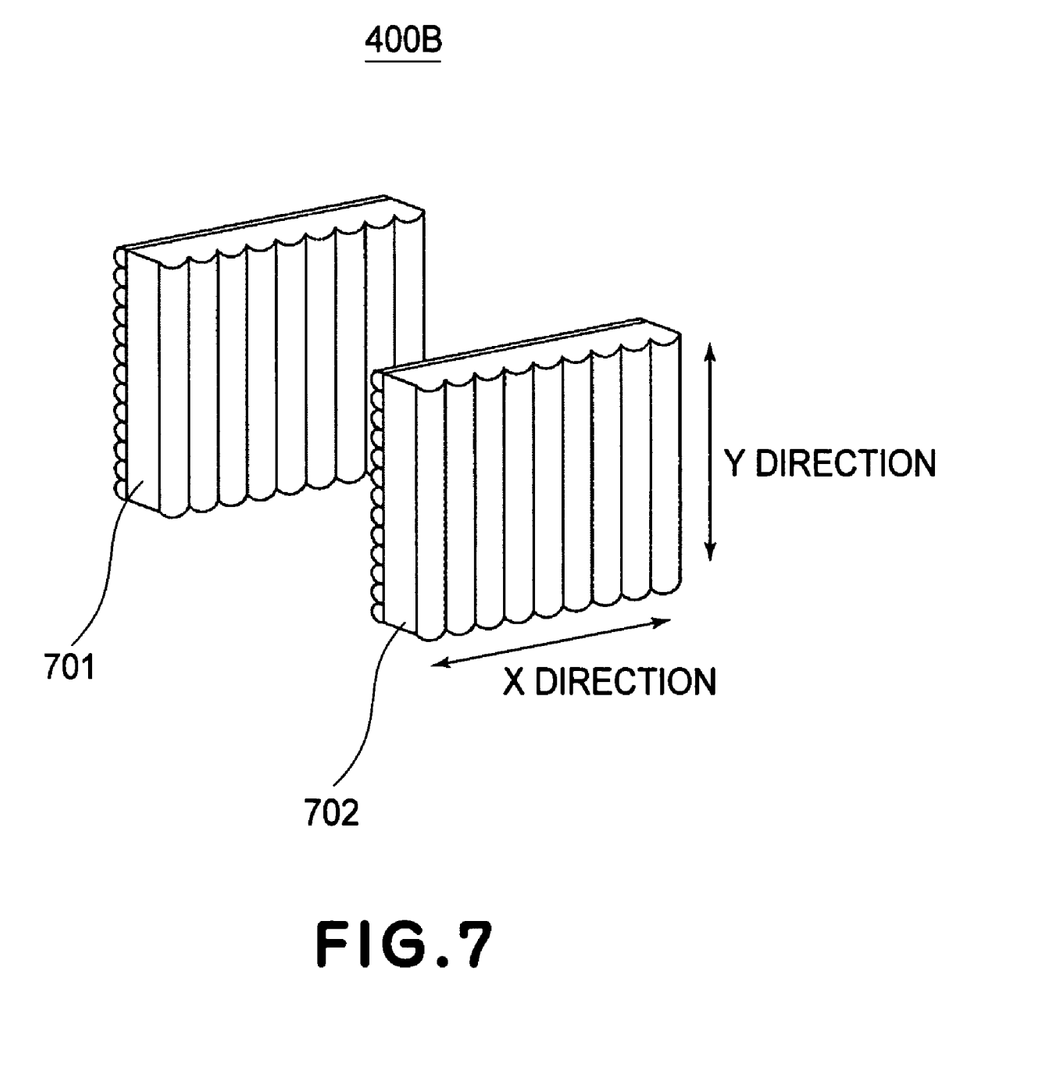
FIG. 7 is a schematic view for explaining micro-lens arrays 400B.

FIG. 7 illustrates another example of micro-lens array 400B usable as the optical integrator 400 of this embodiment. The micro-lens array 400B comprises a pair of lens array sheets 701 and 702. The light entrance side sheet 701 has a light entrance surface defined by micro cylindrical lenses having a curvature only in the Y direction, and a light exit surface defined by micro cylindrical lenses having a curvature only in the X direction.

Similarly, the light exit side sheet 702 has a light exit surface defined by micro cylindrical lenses having a curvature only in the Y direction, and a light exit surface defined by micro cylindrical lenses having a curvature only in the X direction.

Considering the light convergence points produced adjacent the light exit surface of the micro-lens array 400B, if the X direction thereof is disposed at the last, the back focus of the cylindrical lens becomes short in the X direction and long in the Y direction. If the back focus can be made small with respect to the X direction in which the emission NA is large, spherical aberration can be suppressed and, thus, it is advantageous for uniforming the illuminance distribution on the wafer surface in respect to the X direction. On the other hand, since the emission NA is small in the Y direction, prolongation of the back focus does not cause degradation of spherical aberration. Furthermore, in regard to Y direction, since it is averaged due to scan exposure, the illuminance distribution in the Y direction as well can be suppressed sufficiently small.

In consideration of what described above, where a cylindrical micro-lens array is used, preferably the surface that has a curvature corresponding to the X direction should be disposed as the final surface.

However, a condenser lens to be disposed subsequent to it or any matching property with the coating characteristic of each surface from the integrator to the wafer surface may be taken into account, and the surface that corresponds to the Y direction may be disposed as the last surface.

In the micro-lens array comprising two sheet-like structures, if the curvatures at the light entrance surface and the light exit surface of the first sheet array as well as the curvatures at the light entrance surface and the light exit surface of the second sheet array should be made equal to each other, respectively, for efficiency of production procedure, disposition of Y-X-Y-X or disposition of X-Y-X-Y will be necessary.

Here, the division number M with respect to X direction in the FIG. 7 example is set to satisfy a relation $100 \leq M \leq 300$ like the FIG. 6 example, while taking into account the interference fringe on the wafer.

Because of cylindrical lens, it is not always necessary that the curvature in Y direction is registered with the curvature in X direction. Thus, the dividing number N in Y direction can be set as desired independently from the division number M in X direction. Hence, a structure wherein the number of division is same in both of X and Y directions may be used or, alternatively, a structure having different division numbers in X and Y direction may be adopted.

While an embodiment having an optical integrator consisting of micro-lens arrays has been described above, advantageous effects of such structure will be described below.

Figure 8:
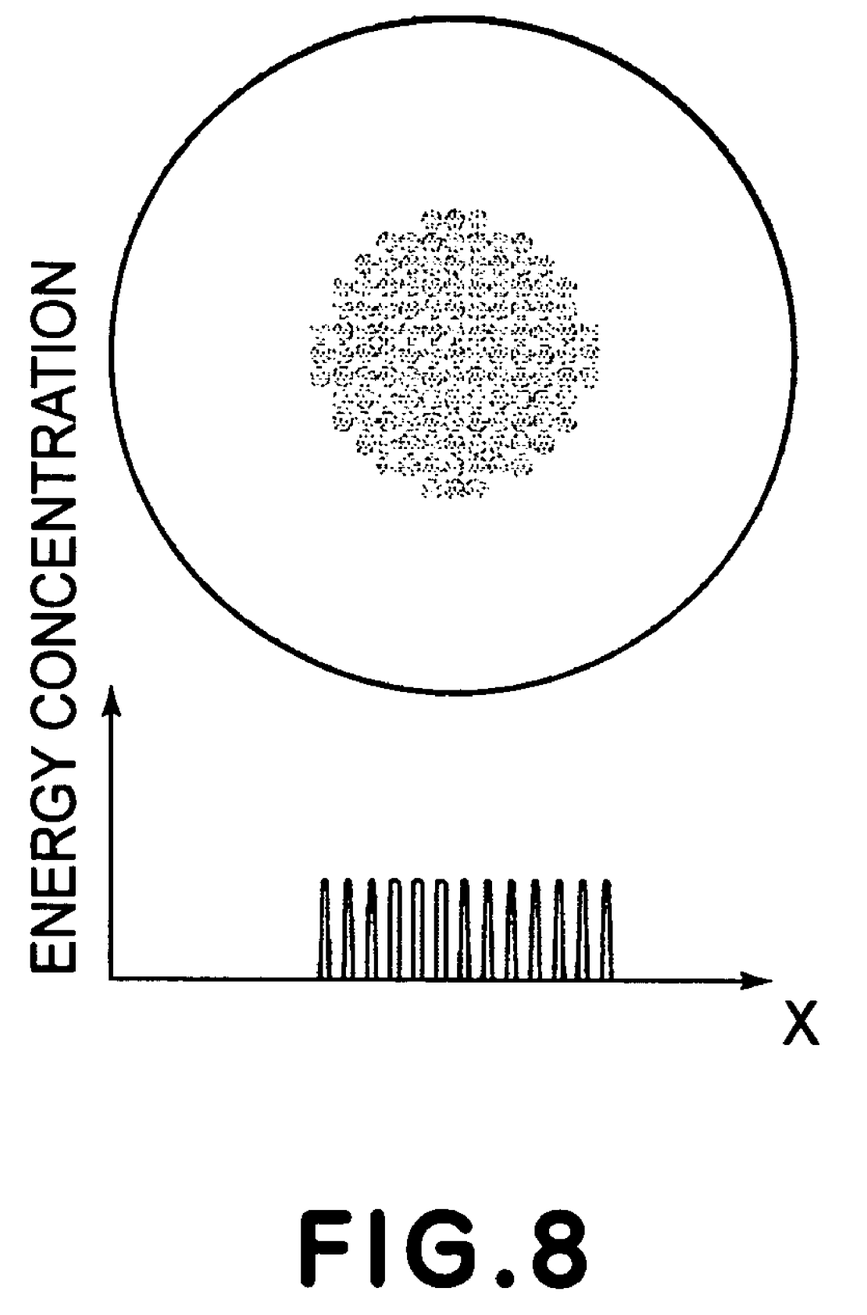
FIG. 8 is a schematic view for explaining an energy distribution adjacent the pupil plane of a projection optical system, produced when a micro-lens array is used.

FIG. 8 is a schematic view, showing an energy distribution adjacent a pupil plane of a projection system in an example wherein a micro-lens array 400A or 400B of this embodiment is used.

As compared with the energy distribution (FIG. 5) provided by a conventional integrator, the number of division is made significantly large and the energy density is well suppressed low.

Hence, use of quartz at the pupil plane of a projection optical system is enabled. This means that a projection optical system having large NA can be accomplished without restriction to the effective diameter of its pupil plane. Therefore, a projection optical system having higher-quality imaging performance can be provided.

Furthermore, since the energy density at a quartz lens can be held at a desired level (e.g., 0.1 mJ/cm$^2$) or lower, good imaging performance can be retained for a long period. Moreover, the difference in magnification telecentricity between illumination modes can be suppressed small.

Embodiment 2

Figure 9:
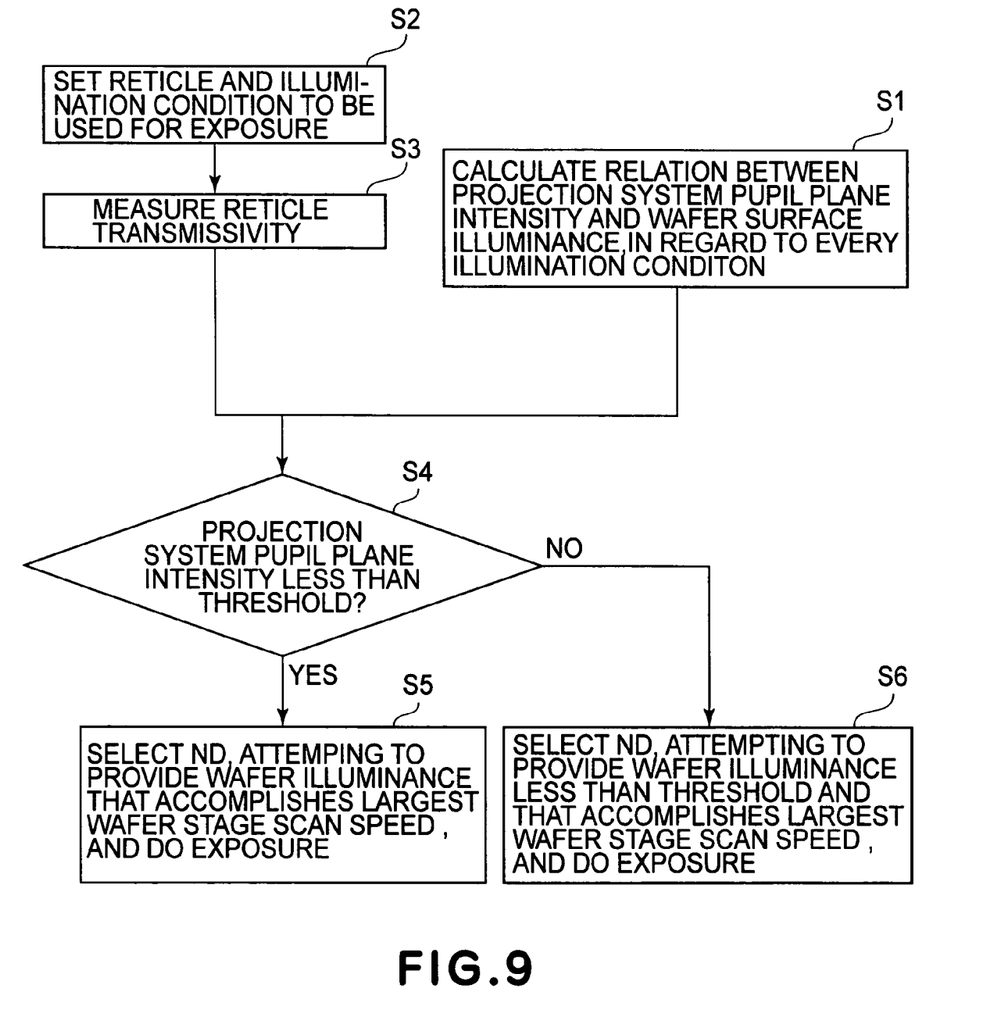
FIG. 9 is a flow chart for explaining an exposure method according to a second embodiment of the present invention.

An exposure method according to a second embodiment of the present invention, that uses an exposure apparatus such as described above, will be explained with reference to the flow chart of FIG. 9.

First of all, under a reticle-free condition, the relationship between the wafer surface illuminance and the projection optical system pupil plane light intensity in different illumination conditions is detected beforehand in accordance with calculations according to design values (Step S1). Subsequently, the illumination condition to be used and a reticle to be used are set in the exposure apparatus (Step S2). Then, the transmittance of the reticle to be used is calculated by measuring the wafer surface illuminance without a reticle and the wafer surface illuminance with a reticle and on the basis of the ratio between them. For measurement of the wafer surface illuminance, the detector 16 provided on the wafer stage 15 is used, and the average light quantity (or integrated light quantity) as the reticle stage 11 is scanningly moved is taken as the wafer surface illuminance (Step S3).

Subsequently, from the results of steps S1 and S3, discrimination is carried out in regard to whether the light intensity on the projection optical system pupil plane is not greater than a threshold (e.g., $0.1$ $mJ/m^2$) (Step S4). Finally, on the basis of the threshold discrimination, an ND element 2 that provides a wafer illuminance with which the scan speed of the wafer stage 15 can be made largest is chosen, and the exposure process is carried out. If the light intensity is larger than the threshold, an ND element 2 that provides a wafer illuminance with which the light intensity on the projection optical system pupil plane becomes not greater than the threshold and with which the scan speed of the wafer stage 15 can be made largest is chosen, and the exposure process is carried out.

Embodiment 3

Next, as a third embodiment of the present invention, a device manufacturing method which uses an exposure apparatus such as described above, will be explained.

Figure 10:
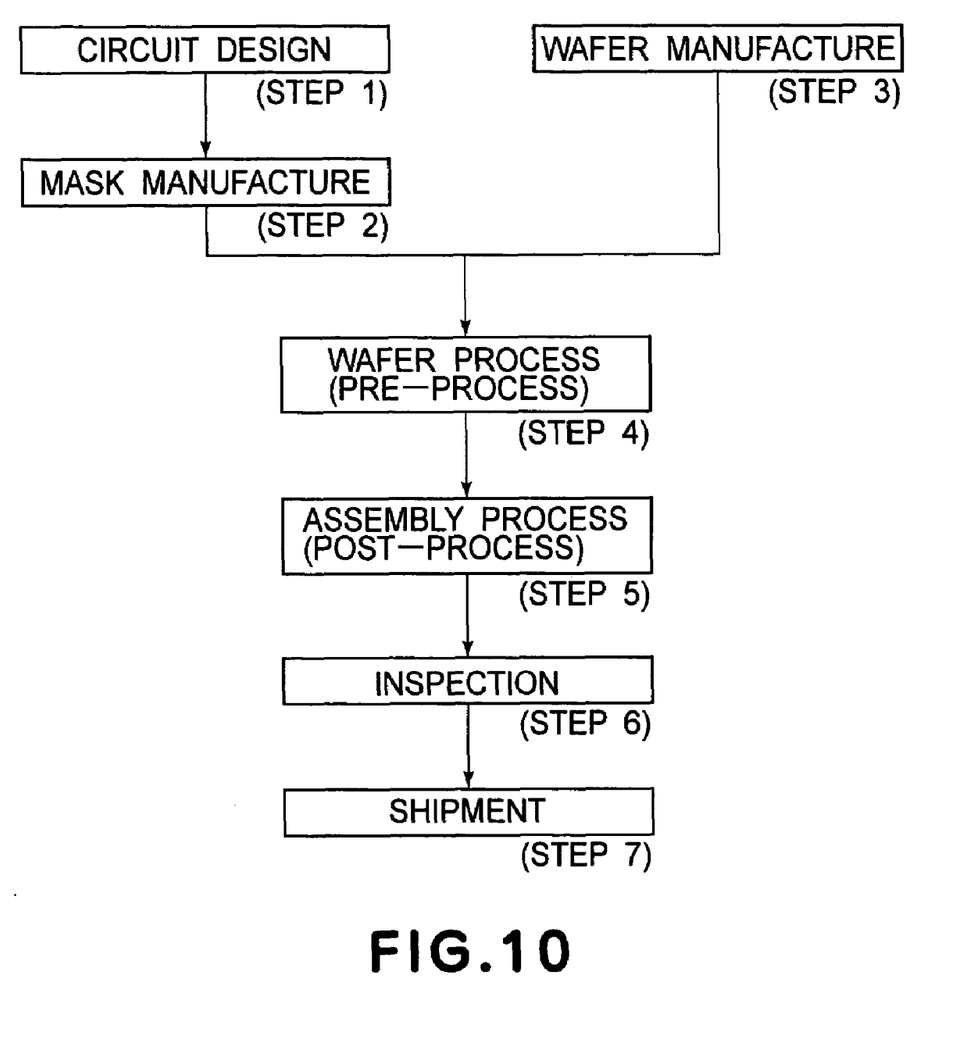
FIG. 10 is a flow chart for explaining device manufacturing processes in a third embodiment of the present invention.

FIG. 10 is a flow chart for explaining the procedure of manufacturing various microdevices such as semiconductor chips (e.g., ICs or LSIs), liquid crystal panels, CCDs, or any other fine patterns made of magnetic materials, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 11:
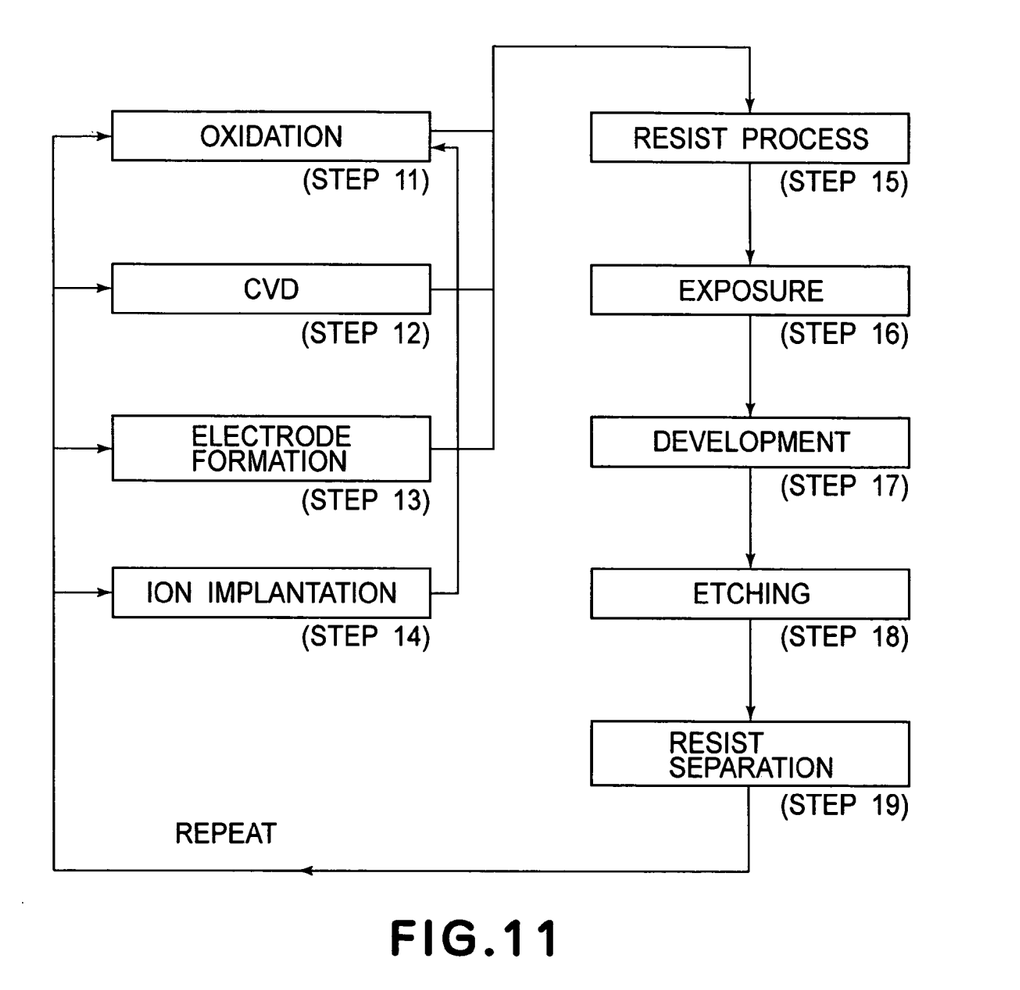
FIG. 11 is a flow chart for explaining details of a wafer process included in the procedure of FIG. 10, in the third embodiment of the present invention.

FIG. 11 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the embodiments of the present invention as described above, a projection optical system having a sufficient diameter on its pupil plane even with large NA and being capable of correcting chromatic aberration satisfactorily can be accomplished. This enables avoiding or reducing various limitations in regard to design or production of the projection optical system. Hence, according to the present invention, a projection optical system having high-quality imaging performance is provided.

Furthermore, with the present invention, even under an illumination condition where the light emission portion on the pupil plane is small (that is, small-sigma illumination or dual-pole illumination, for example), the wafer surface illuminance can be maintained with high efficiency. This is very effective to the device productivity.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-123870 filed Apr. 20, 2004, for which is hereby incorporated by reference.

What is claimed is:

1. A scanning exposure apparatus, comprising:
an illumination optical system for illuminating an original with light from a light source; and
a projection optical system for projecting a pattern of the original onto a substrate;
wherein said illumination optical system includes an optical integrator of wavefront division type, for forming a secondary light source by use of light from the light source and a condenser optical system for directing light from said optical integrator to the original;
wherein said projection optical system includes an optical element made of a glass material of quartz and being disposed adjacent a pupil plane of said projection optical system; and
wherein, regarding the number of division upon the pupil plane of the projection optical system, where said optical integrator of wavefront division type is divided by a number N with respect to a scan direction and also said optical integrator is divided by a number M with respect to a direction orthogonal to the scan direction, relations $100 \leq M \leq 300$ and $M \leq N$ are satisfied.

2. An apparatus according to claim 1, wherein said optical integrator comprises two sheet-like structures of micro-lens arrays.

3. An apparatus according to claim 2, wherein each lens of said micro-lens array has a shape substantially analogous to an illumination region to be defined on the substrate.

4. An apparatus according to claim 2, wherein each micro-lens array comprises a cylindrical lens array.

5. An apparatus according to claim 4, wherein one of a light entrance surface and a light exit surface of each of the two sheet-like structures of micro-lens arrays has a curvature with respect to a widthwise direction of an illumination region to be defined, and wherein the other has a curvature with respect to a lengthwise direction of the illumination region.

6. An apparatus according to claim 1, further comprising a control system for controlling the illuminance on the substrate on the basis of the illuminance on the substrate and an energy density adjacent the pupil plane of said projection optical system.

7. An apparatus according to claim 6, wherein said control system performs the control so that the energy density at a lens adjacent the pupil plane of said projection optical system is maintained continuously at 0.1 mJ/cm$^2$ or lower regardless of a change in illumination condition and/or replacement of the original.

8. An apparatus according to claim 1, wherein the light comprises an ArF excimer laser.

9. A device manufacturing method, comprising the steps of: exposing a substrate by use of an exposure apparatus as recited in claim 1; and developing the exposed substrate.

* * * * *